(12) United States Patent
Yoshioka et al.

(10) Patent No.: US 7,967,048 B2
(45) Date of Patent: Jun. 28, 2011

(54) TRANSFERRING DEVICE AND TRANSFERRING METHOD

(75) Inventors: Takahisa Yoshioka, Tokyo (JP); Yoshiaki Sugishita, Tokyo (JP)

(73) Assignee: Lintec Corporation, Tokyo (JP)

( * ) Notice: Subject to any disclaimer, the term of this patent is extended or adjusted under 35 U.S.C. 154(b) by 356 days.

(21) Appl. No.: 12/111,483

(22) Filed: Apr. 29, 2008

(65) Prior Publication Data

US 2008/0277041 A1    Nov. 13, 2008

(30) Foreign Application Priority Data

May 7, 2007 (JP) .................................. 2007-122302

(51) Int. Cl.
| | |
|---|---|
| *B29C 65/48* | (2006.01) |
| *B32B 37/12* | (2006.01) |
| *B32B 38/10* | (2006.01) |
| *B32B 39/00* | (2006.01) |
| *B32B 37/14* | (2006.01) |
| *B32B 37/26* | (2006.01) |
| *B31F 5/06* | (2006.01) |
| *B32B 37/10* | (2006.01) |
| *B65H 29/02* | (2006.01) |

(52) U.S. Cl. ........ 156/538; 156/362; 156/363; 156/537; 156/556

(58) Field of Classification Search .................. 156/538, 156/362, 363, 539, 537, 556, 306.3, 323, 156/344, 391, 540, 580, 584

See application file for complete search history.

(56) References Cited

U.S. PATENT DOCUMENTS

| | | | | |
|---|---|---|---|---|
| 6,663,740 | B2* | 12/2003 | Yamasaki | 156/248 |
| 6,863,590 | B2* | 3/2005 | Kobayashi | 451/5 |
| 7,520,309 | B2* | 4/2009 | Priewasser | 156/382 |
| 7,611,600 | B2* | 11/2009 | Tsujimoto et al. | 156/249 |
| 2006/0231202 | A1* | 10/2006 | Sakata et al. | 156/344 |
| 2008/0011412 | A1* | 1/2008 | Tsujimoto et al. | 156/193 |
| 2008/0044258 | A1* | 2/2008 | Akechi | 414/217.1 |

FOREIGN PATENT DOCUMENTS

| | | | |
|---|---|---|---|
| JP | 10-242249 A | | 9/1998 |
| JP | 10242249 A | * | 9/1998 |
| WO | WO 2005106945 A1 | * | 11/2005 |

OTHER PUBLICATIONS

English translation of JP 10-242249, Mori et al.—Sep. 11, 1998.*

* cited by examiner

*Primary Examiner* — Sonya Mazumdar
(74) *Attorney, Agent, or Firm* — Westerman, Hattori, Daniels & Adrian, LLP

(57) ABSTRACT

A transferring device 10 for transferring plate-like members such as a semiconductor wafer and the like among the first table T1, the second table T2 and the third table T3. The transferring device 10 includes a supporting unit provided with a supporting face for the semiconductor wafer W, and a multi joint robot 12 for transferring the supporting unit 11. The supporting face includes an adhesive sheet S in which an adhesive layer A is laminated on a sheet base material SB, and transferring among the table T1 through T3 can be performed through sticking and peeling operation between the adhesive sheet S and the semiconductor wafer.

8 Claims, 5 Drawing Sheets

TRANSFERRING DEVICE AND TRANSFERRING METHOD

BACKGROUND OF THE INVENTION

1. Field of the Invention

The present invention relates to a transferring device and a transferring method, in particular, to a transferring device and a transferring method suitable for transferring a plate-like member such as a semiconductor wafer and the like as an object.

2. Related Art

Generally, a semiconductor wafer (hereinafter, simply referred to as "wafer") undergo various processes over time such as sticking a protective sheet on the circuit surface side thereof before a grinding of the rear surface. Duration of intervals between such processes, transferring operations are involved among placing means of wafer such as tables or the like via an appropriate transferring device or conveyance device.

Patent Document 1 discloses a transferring device having a robot arm that sucks and holds the wafer.

[Patent Document 1] Japanese Patent Application Laid-Open No. 10-242249

However, in the transferring device disclosed in the Patent Document 1, the device is arranged so as to suck and hold wafer. Therefore in the case where the transferring device is used for transferring an ultra-thin wafer that has been achieved recently down to several tens of micron meter in thickness and that the size of plane figure thereof has been upsized in recent years, wafer tends to be cracked due to partial load incurred to the wafer accompanied with sucking, and the peripheral side of the wafer is inclined to be sagged, which causes breakage of the peripheral area thereof because the peripheral area touches the table face firstly when transferring the wafer onto the table.

SUMMARY OF THE INVENTION

The present invention has been proposed in view of the foregoing disadvantages. An object of the present invention is to provide a transferring device and a transferring method suitable for transferring a plate-like member while avoiding damage causes even for the plate-like member such as upsized and ultra-thin wafer and the like.

In order to achieve the above object, the present invention adopts such an arrangement that a transferring device that transfers a plate-like member among a plurality of placing means on which the plate-like member is placed, comprising:

a supporting means provided with a supporting face for the plate-like member; and a moving means to move the supporting means, wherein the supporting face includes an adhesive sheet in which an adhesive layer is laminated on a sheet base material, and wherein the plate-like member is transferred among the placing means through sticking and peeling operation of the adhesive sheet to and from the plate-like member.

In the present invention, it is preferable to adopt such an arrangement that the supporting means includes a feed-out section for supporting a strip-like adhesive sheet so as to be fed out, and a winding section for winding the adhesive sheet fed out from the feed-out section, and the adhesive sheet between the feed-out section and the winding section is made to be the supporting face.

The supporting face is arranged to be stuck to the whole surface of the plate-like member corresponding to the supporting face.

Further, the supporting means may be arranged so as to stick the adhesive sheet to the plate-like member and/or peel off the adhesive sheet therefrom starting from one edge portion toward another edge portion in a side view of the plate-like member.

In addition, such an arrangement may be adopted that the adhesive layer is an adhesive layer of energy ray curable type and the supporting means further includes an energy ray irradiation means.

Furthermore, such an arrangement may be adopted that the supporting means includes a displacement means to displace partially a position of the adhesive sheet.

Still further, such an arrangement is preferably adopted that the displacement means displaces the adhesive sheet when the adhesive sheet is stuck to the plate-like member so that sticking operation is executed from a central portion toward both edge portions in a side view of the plate-like member synchronously with the moving means.

Further, the displacement means may be arranged to displace the adhesive sheet when the adhesive sheet stuck to the plate-like member is peeled off from the plate-like member so that peeling operation is executed from both edge portions toward a central portion in a side view of the plate-like member synchronously with the moving means.

In addition, the present invention adopts a transferring method for transferring a plate-like member among a plurality of placing means for placing a plate-like member, comprising the steps of:

sticking an adhesive sheet provided on a supporting means onto the plate-like member placed on the placing means, and supporting the plate-like member;

moving the supporting means to a side of other placing means, and placing the plate-like member on the placing means; and subsequently, transferring the plate-like member through peeling operation of the adhesive sheet from the plate-like member.

In the above transferring method, when sticking the adhesive sheet to the plate-like member and/or peeling off the adhesive sheet therefrom, such a method may be adopted that sticking is executed from one edge side toward another edge side in a side view of the plate-like member.

In addition, in the above transferring method, when sticking the adhesive sheet to the plate-like member, such a method is preferably adopted that sticking is executed from a central portion toward both edge portions in a side view of the plate-like member.

Furthermore, when transferring the pate-like member, such a method is preferably adopted that the adhesive sheet stuck to the plate-like member is peeled off from both edge portions toward central portion in a side view of the plate-like member.

According to the present invention, due to the fact that the supporting face of the supporting means has an adhesive sheet, the plate-like member can be supported by sticking the adhesive sheet to the plate-like member. Therefore partial load on the plate-like member that can happen in the case of suction supporting is eliminated and cracks of the plate-like member as well as relative sagging of the peripheral portion can be effectively avoided.

In addition, according to the arrangement in which the supporting means is provided with the feed-out section and the winding section of the adhesive sheet, the supporting face area can be renewed through the operation of feeding out and winding of the adhesive sheet, whereby stable adhesive strength can be maintained.

Moreover, when the supporting face is arranged so as to be stuck to the whole surface of the plate-like member corresponding to the same, sagging of the peripheral portion thereof can be securely prevented to eliminate the peripheral portion damage when placing onto the table, even if the plate-like member is the ultra thin wafer of several tens of micron meter in thickness.

Further, in the arrangement where the adhesive layer of energy ray curable type is employed and the energy irradiation means is provided in the supporting means, the adhesive sheet can be easily peeled off from the plate-like member.

Still further, sticking and peeling operation is arranged in such a mode that the operation is commenced from the edge portion of the plate-like member, peeling resistance of the adhesive sheet can be reduced.

Meanwhile, in the arrangement that includes a displacement means to displace partially the face position of the adhesive sheet, sticking operation of the adhesive sheet to the plate-like member can be implemented from the central portion thereof toward the both edge portions, for example, in the side view of the plate-like member, whereby air trap between the adhesive sheet and the plate-like member can be eliminated, which enables to support securely.

EXPLANATION OF REFERENCE NUMERALS

Figure 1:
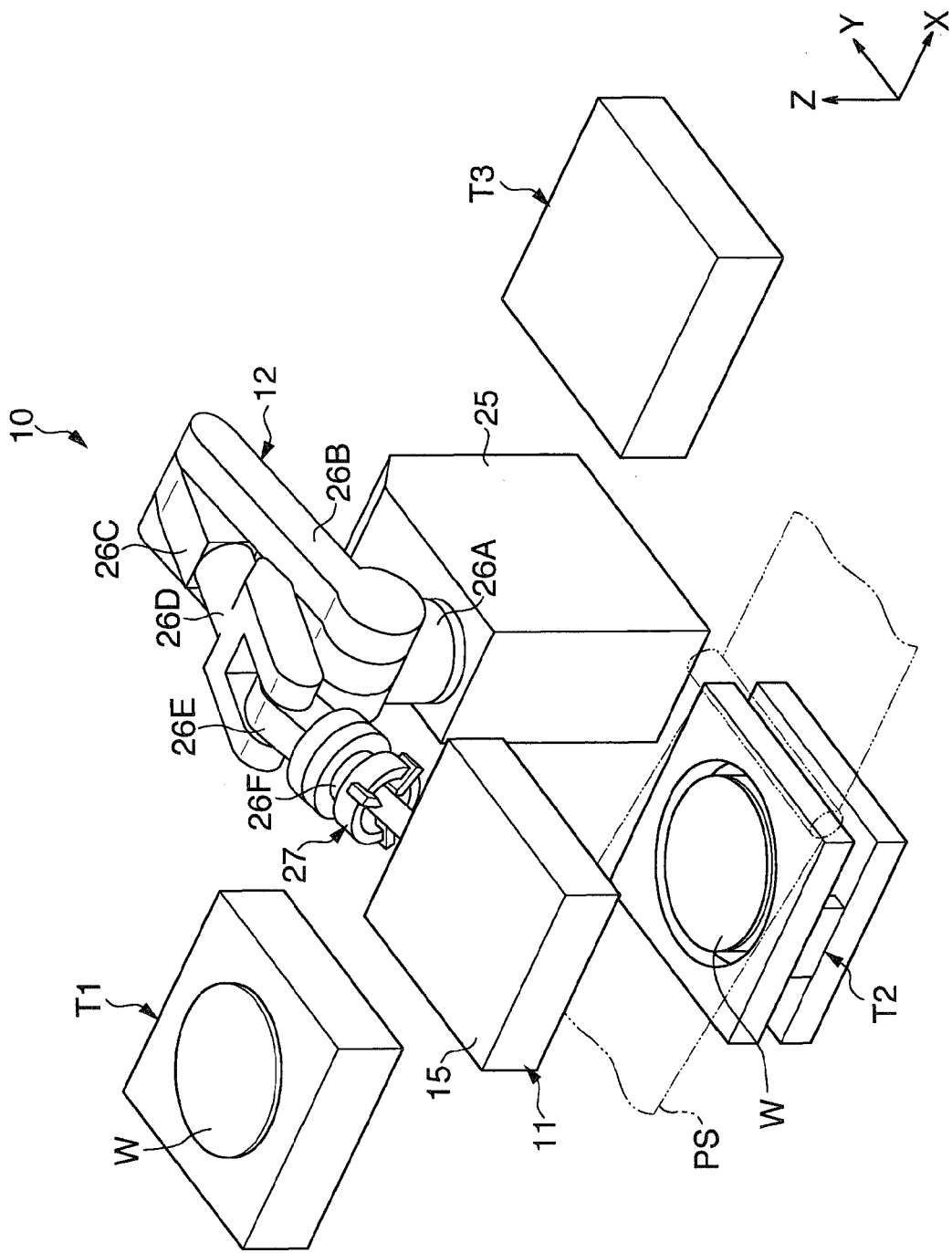
FIG. 1 is a schematic perspective view of the overall structure of a transferring device according to an embodiment of the present invention.

10: sheet sticking device
11: supporting means
12: multi joint robot (moving means)
16: feeding-out roller (feeding-out section)
17: winding roller (winding section)
23: halogen lamp (ultra violet ray irradiation means)
30: displacement means
T1: first table (placing means)
T2: second table (placing means)
T3: third table (placing means)
A: adhesive layer
S: adhesive sheet (supporting face)
SB: sheet base material
W: semiconductor wafer (plate-like member)

DETAILED DESCRIPTION OF THE PREFERRED EMBODIMENT

Now, referring to the drawings, preferred embodiment of the present invention will be described below.

Figure 2:
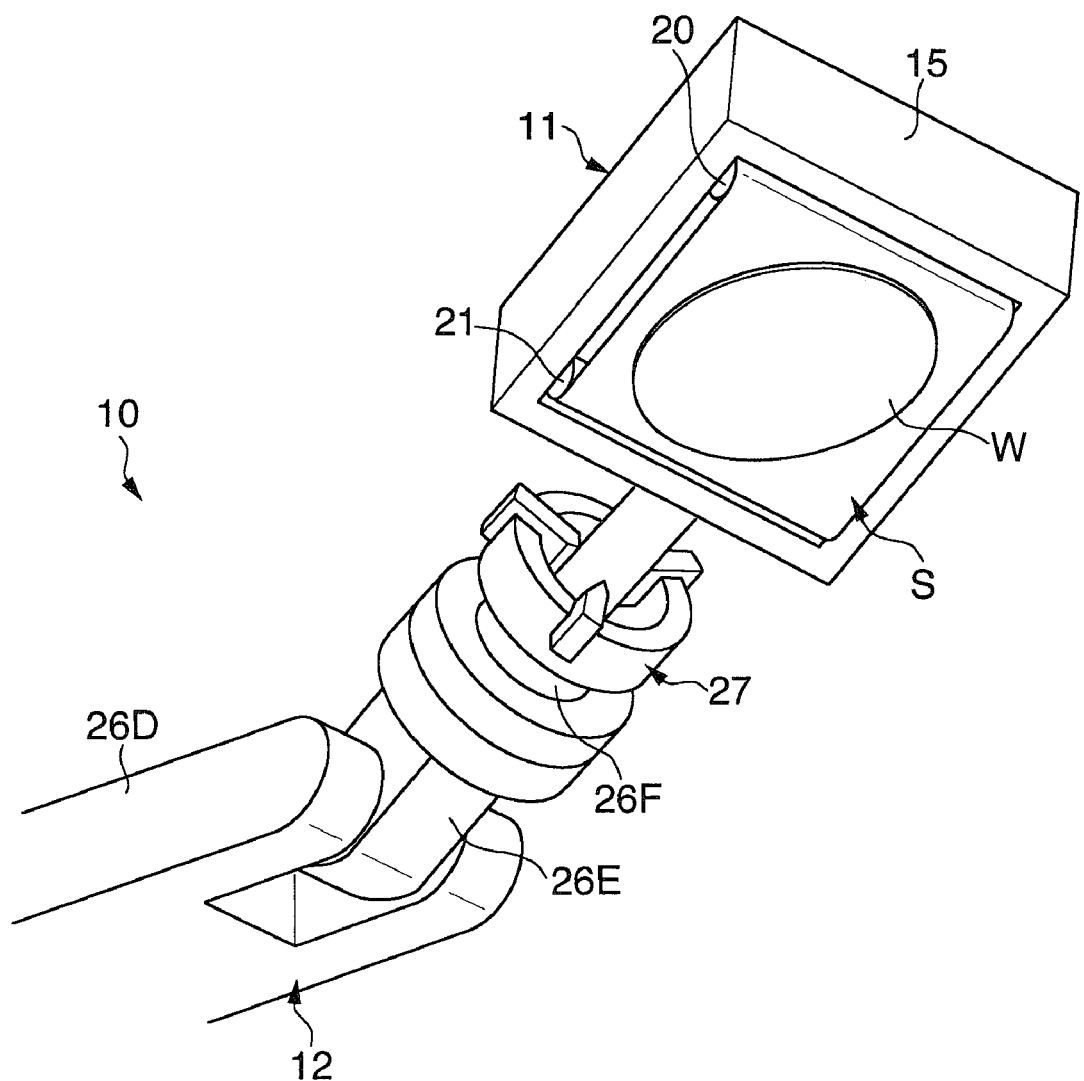
FIG. 2 is a schematic perspective view of the principal part of the transferring device.

FIG. 1 illustrates a schematic perspective view of a transferring device according to the present invention, and FIG. 2 illustrates a schematic perspective view of the principal part of the transferring device. In these drawings, the transferring device 10 is arranged so that a wafer W as a plate-like member is transferred among a first table T1, a second table T2 and a third table T3 which form a placing means. The transferring device 10 includes, as shown in FIG. 2, a supporting means 11 having an adhesive sheet S which forms a supporting face for the wafer W, and a multi joint robot 12 as a moving means which moves the supporting means 11 among the tables 1, 2 and 3. As for the adhesive sheet S, as shown in the enlarged portion P of FIG. 3(A), such a layer structure type adhesive sheet is adopted that an adhesive layer A is laminated on one side of the sheet base material SB, the adhesive layer A being an energy ray curable type, especially ultraviolet curable type in the present embodiment. The width dimension of the adhesive sheet S is arranged to be larger than the maximum dimension of the wafer W, due to which the adhesive sheet S can be stuck to the whole upper-surface of the wafer W.

Figure 3A:
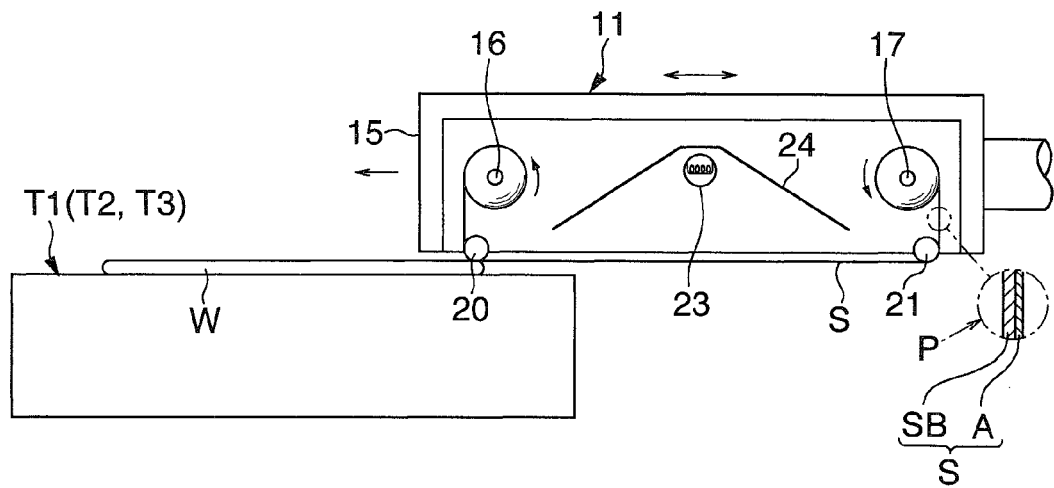
FIGS. 3(A) to 3(B) are side views illustrating an operation of supporting and transferring the wafer.
Figure 3B:
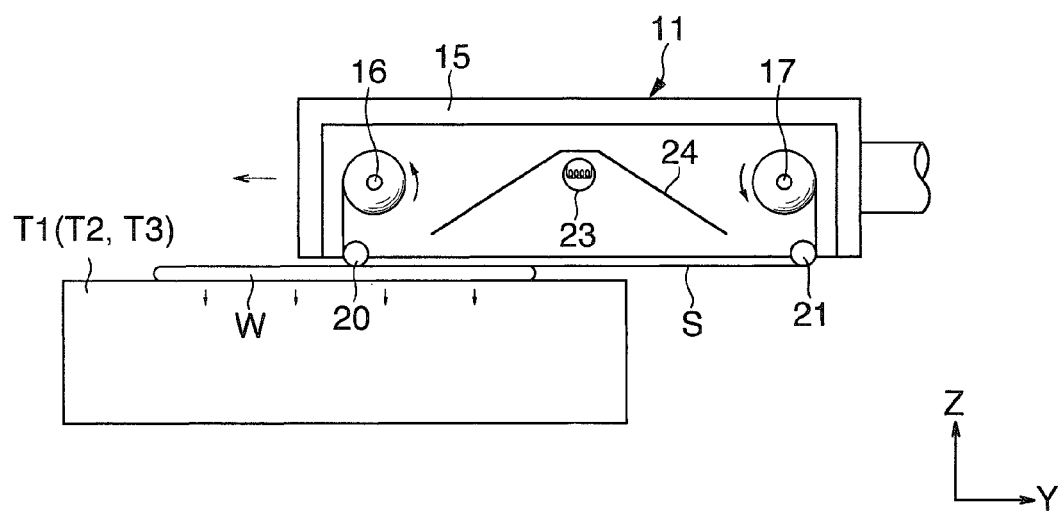
Figure 4A:
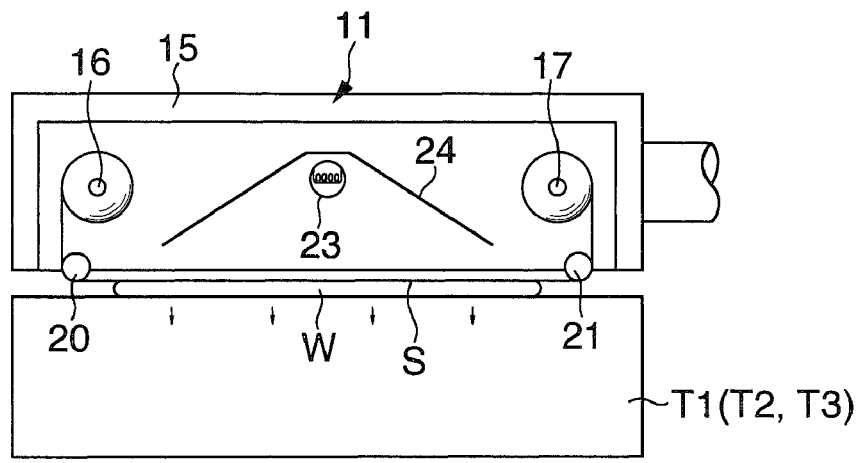
FIGS. 4(A) to 4(B) are side views illustrating an operation of supporting and transferring the wafer, following the operation shown in FIG. 3.
Figure 4B:
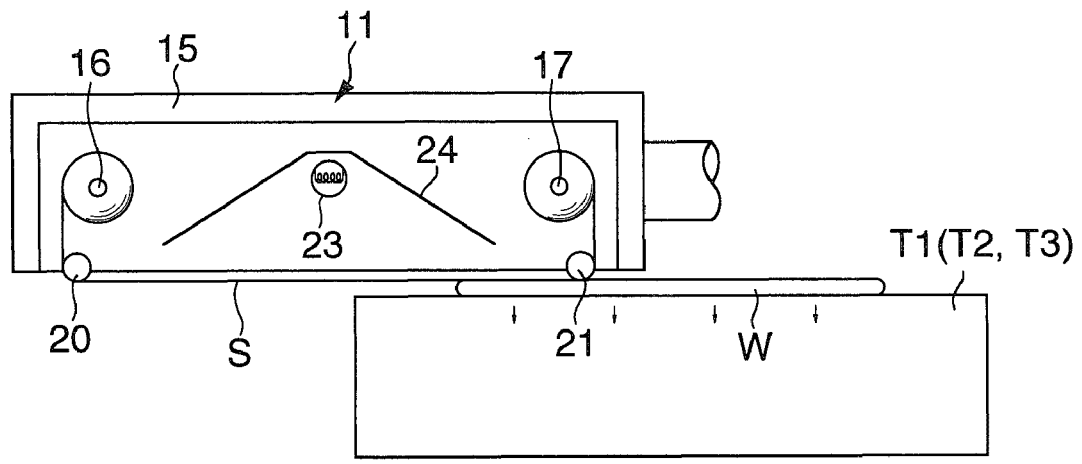
Figure 4B:
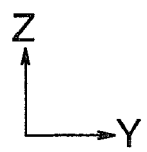

As shown in FIG. 2 to FIG. 4, the supporting means 11 comprises main body case 15 usually opened downwardly, a feed-out roller 16 as a feed-out section disposed in the main body case 15, holding a roll of the adhesive sheet S enabling being fed out, a winding roller 17 as a winding section for winding the adhesive sheet S fed out from the feed-out roller 16, a pair of guide rollers 20, 21 having the function of applying pressing force on the adhesive sheet S, the guide rollers 20, 21 being supported in rotatable manner within the case 15 and disposed under the feed-out roller 16 and the winding roller 17 as shown in FIG. 3, and a halogen lamp 23 and a reflection hood 24 as a ultraviolet ray irradiation means for irradiating the ultraviolet ray onto the adhesive sheet S from the base material SB side of the same. The feed-out roller 16 and the winding roller 17 are arranged respectively to rotate forward and reverse direction so as to control the tension and the feeding speed of the adhesive sheet S fed out between the rollers 16 and 17 by means of motors, not shown in the drawing, in a synchronized operation.

The multi joint robot 12, as shown in FIG. 1, includes a base portion 25, the first arm 26A through the sixth arm 26F disposed on the upper face side of the base portion 25, and a holding chuck 27 fixed at the edge portion of the sixth arm 26F. The second, the third and the fifth arm 26B, 26C and 26E are respectively arranged rotatably in a plane Y and Z, and the first, the fourth and the sixth arm 26A, 26D and 26F are arranged rotatably around the respective axis thereof. The multi joint robot 12 is controlled by Numerical Control. That is to say, the movement of each joint with respect to the object is controlled by numerical information corresponding to each joint, and the all movements are controlled by a program.

The multi joint robot 12 in the present embodiment is substantially identical with the one described in the Patent Application 2006-115106 filed already by the applicant of the present invention, whereby detailed description is omitted here.

In the present embodiment, the first table T1 forming a placing means is to support the wafer W transferred via a conveying arm and the like, not shown, and the wafer W is transferred to the second table T2 via the transferring device 10. Onto the upper face of the wafer W (circuit face) transferred to the second table T2, a strip-like protective sheet PS is provided via a sheet sticking device, not shown, to be stuck. Then the protective sheet PS is cut so as to meet the size of wafer W, in exemplification in substantially round shape, and the wafer W stuck with the protective sheet PS is transferred to the third table T3 via the transferring device 10. The upper surface side of each table, T1 to T3, is arranged to have a sucking function of the wafer W.

Next the transferring method is described about the case of transferring the wafer W from the table T1 to the table T2.

When the wafer W supported by the upper face of the table T1 is transferred to be placed on the second table T2 via the transferring device 10, as shown in FIG. 3(A), the adhesive sheet S between the guide rollers 20, 21 in the supporting means 11 is located to be parallel to the wafer W and descends toward the table T1 while keeping the parallel condition. In that case, the multi joint robot is controlled by the predetermined program so that a portion of the adhesive sheet S located directly beneath the guide roller 20 contacts firstly with an upper surface of the right side edge of the wafer W, which is one of the edges in the side view thereof.

Subsequently while the multi joint robot 12 performs an predetermined operation so that the supporting means 11 moves to the left in the direction of Y axis, the feed-out roller 16 and the winding roller 17 are rotated anticlockwise synchronously via motors, not shown, (arrow-direction in FIG. 3(A)) and the adhesive sheet S supported by the feed-out roller 16 are fed out to be stuck onto the wafer W (see FIG. 3(B)).

After the guide roller 20 passes opposite side of the wafer W (left edge side) and when the wafer W is located at predetermined position between a pair of guide rollers 20, 21, the sticking operation of the adhesive sheet S is completed (see FIG. 4(A)). Note that during sticking operation, the table T1 sucks the wafer W via the sucking mechanism, which is not shown, so that the wafer W does not move in a plane direction.

After the wafer W is stuck to the adhesive sheet S and is supported by the supporting means 11 as described above, sucking function of the wafer W by the table T1 is released and the wafer W is transferred to the table T2 by the operation of the multi joint robot 12, meanwhile ultraviolet ray by the halogen lamp 23 is irradiated to the adhesive sheet S so as to cure the adhesive layer A.

After the supporting means 11 moves by the multi joint robot 12 to such a position that the wafer W comes to a surface contact situation with the upper surface of the second table T2, the wafer W is sucked and held on the upper surface of the second table T2. When the supporting means 11 is further moved to the left horizontally, the adhesive sheet S can be peeled off from the right edge side of the wafer W (see FIG. 4(B)).

The upper surface that is the circuit surface of the wafer W transferred to the second table T2 is stuck with a protective sheet PS via a sticking device, not shown. Thereafter, the protective sheet PS is cut in accordance with the size of wafer W, and the wafer W on which the protective sheet PS is stuck is transferred to the third table T3 via the supporting means 11. In that case, the transferring operation is substantially identical with the transferring operation from the first table T1 to the second table T2 apart from the existence of the protective sheet PS between the adhesive sheet S and the wafer W.

According to the embodiment as described above, since the whole surface of the wafer W corresponding to the adhesive sheet S is stuck with the adhesive sheet S, even if the wafer W is the ultra-thin type ground down to several tens of micron meter in thickness, for example, the wafer W is not suffered from any partial load due to suction, which is the conventional disadvantage, moreover in the transferring operation there is not any sagging problems in peripheral sides whereby the wafer can be transferred without any damage cause on the wafer W which produces a superior effect than ever.

The most preferable arrangements and methods to implement the present invention have been disclosed so far. The present invention, however, is not limited to the above.

That is to say, the present invention has been illustrated and described mainly on specific embodiments. However it is possible for those skilled in the art to add various modifications, if necessary, to the above-described embodiment with respect to shape, quantity, and other detailed arrangement without departing from the technical spirit and the range of the object of the present invention.

Therefore, description disclosed above restricting the shape and the like is exemplified for easy understanding of the present invention, and is not restricting the present invention, accordingly description by the names of components avoiding a part of or the whole restrictions of the shapes and the like is to be involved in the present invention.

Figure 5:
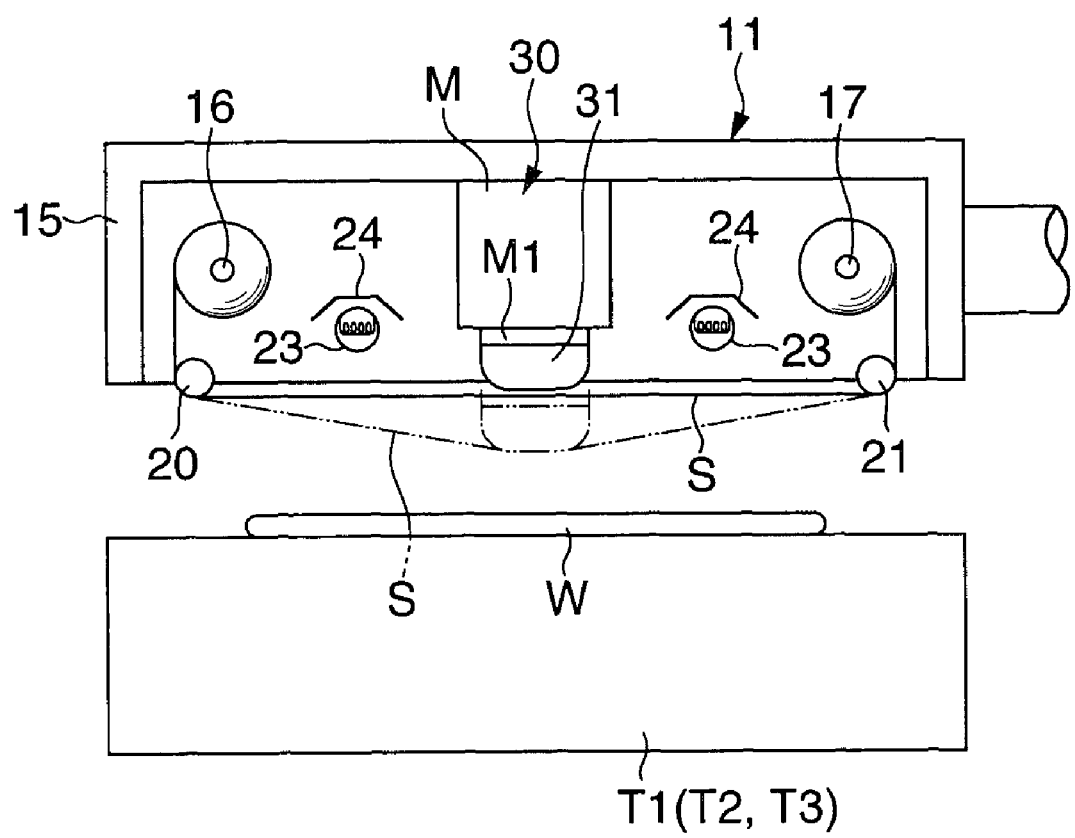
FIG. 5 is a side view illustrating a modified example.

For example, the above-described embodiment is illustrated for the case where the adhesive sheet S is stuck and peeled from one edge to the other edge of the wafer W viewing it from the side. However the present invention is not limited to the above. For example, as shown in FIG. 5, such an arrangement can be adopted that a displacement means 30 is provided in the supporting means 11. More specifically, the displacement means 30 is provided with a linear motor M disposed on the ceiling wall center of the case main body, and a displacement member 31 fixed at the top edge on a rod M1 of the linear motor M, the displacement member 31 having substantially the same width to the dimension of the width direction of the adhesive sheet S perpendicularly to the feed-out direction thereof, and also the halogen lamp 23 as well as the reflection hood 24 are arranged to be disposed at the sides of the linear motor M. The linear motor M gives a displacement to the upper face of the central portion of the adhesive sheet S (supporting face) between the guide rollers 20, 21 toward the wafer W side via the displacement member 31 by forward movement of the rod M1 (see two-dot chain line in FIG. 5) so that the central portion of the adhesive sheet S approaches the wafer W relatively with respect to both the left and right sides shown in FIG. 4.

For that reason, when the adhesive sheet S is stuck to the wafer W, that is supported by the first table T1, the adhesive sheet S is stuck to the wafer W starting from the central portion in the side view of the wafer W, and thereafter while the supporting means 11 descends via the multi joint robot 12, the rod M1 is retracted synchronously accompanying with the movement of the supporting means 11, which extends the sticking area toward the both sides so that the whole area is stuck. And when the wafer W transferred and stuck to the supporting means 11 side and supported thereby is transferred to the second table T2, the wafer W is placed on the second tale T2 maintaining the horizontal posture of the adhesive sheet S (keeping the rod M1 of the linear motor M in the retracted position), and thereafter while the adhesive sheet S is depressed to the wafer W side by the displacing means 31, the supporting means 11 is moved synchronously with the movement of the multi joint robot 12 so as to move upward away from the second table T2. Thus the adhesive sheet S can be peeled off starting from the both left and right sides toward the central portion in the side view of the wafer W to separate the adhesive sheet S and the wafer W, which completes the transferring operation. Other arrangement and operations are substantially identical to the embodiment.

According to such the modification described above, alternative mode of sticking and peeling is available to execute transferring operation.

In addition, in the aforementioned embodiment, the case where the adhesive layer A of the adhesive sheet S is the ultraviolet ray curable type was described. The present invention may adopt other adhesive layer types which are cured by irradiation of other energy ray such as ultra-red ray and the like. For such cases, the energy ray irradiation device may be changed accordingly.

Moreover, the plate-like member is not limited to the wafer W but glass plate, steel plate, or resin plate and the like, as well as other plate-like members may be included. And the semiconductor wafer may include silicon wafer and compound wafer.

Further, in the operating description using FIGS. 3 and 4, the process was described in the flow from (A) to (B). However, after placing the wafer W as shown in FIG. 4(A), the multi joint robot 12 may be performed in a predetermined operation so that the supporting means 11 moves to the right side in the direction of Y axis and the feed-out roller 16 and the winding roller 17 may be rotated clockwise (the opposite direction of the arrow in FIG. 3(A)) via motors, which are not shown, so that the feed-out roller 16 is operated to wind the adhesive sheet S and the adhesive sheet S is peeled from the left edge side of the wafer W. In such a case, the same adhesive sheet area can be used in plural times for sticking and transferring, resulting in running cost reduction. Note that after the predetermined number of sticking and transferring operations are carried out, controlling is required so that a following area of the adhesive layer A positions.

What is claimed is:

1. A transferring device that transfers a plate-like member among a plurality of tables on which said plate-like member is placed, comprising:
    a supporting means provided with a supporting face configured to support said plate-like member; and
    a robot configured to move the supporting means,
    wherein said supporting face includes an adhesive sheet in which an adhesive layer is laminated on a sheet base material, and
    wherein said plate-like member is transferred among said plurality of tables by a sticking and peeling operation of said adhesive sheet to and from said plate-like member.

2. The transferring device according to claim 1,
    wherein said supporting means includes a feed-out section for supporting and feeding out the adhesive sheet and a winding section for winding the adhesive sheet fed out from the feed-out section, and
    wherein said supporting face is a portion of the adhesive sheet between the feed-out section and the winding section.

3. The transferring device according to claim 1, wherein said supporting face is configured to stick to the whole surface of the plate-like member.

4. The transferring device according to claim 1, wherein said supporting means sticks said adhesive sheet to the plate-like member and/or peels off said adhesive sheet from the plate-like member by moving from a first edge portion toward a second edge portion, in a side view of said plate-like member.

5. The transferring device according to claim 1,
    wherein said adhesive layer is an energy ray curable adhesive layer, and
    wherein said supporting means further includes an energy ray irradiation means.

6. The transferring device according to claim 1, wherein said supporting means includes a displacement means to partially displace a position of said adhesive sheet.

7. The transferring device according to claim 6, wherein said displacement means displaces said adhesive sheet when said adhesive sheet is stuck to the plate-like member so that sticking operation is executed from a central portion toward both edge portions, in a side view of said plate-like member, synchronously with said moving means.

8. The transferring device according to claim 6, wherein said displacement means displaces said adhesive sheet when said adhesive sheet stuck to said plate-like member is peeled off from the plate-like member so that peeling operation is executed from both edge portions toward a central portion, in a side view of said plate-like member, synchronously with said moving means.

* * * * *